(12) United States Patent
Li et al.

(10) Patent No.: US 12,133,378 B2
(45) Date of Patent: Oct. 29, 2024

(54) SEMICONDUCTOR STRUCTURE

(71) Applicant: NANYA TECHNOLOGY CORPORATION, New Taipei (TW)

(72) Inventors: Wei Zhong Li, Taoyuan (TW); Hsih Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 421 days.

(21) Appl. No.: 17/707,977

(22) Filed: Mar. 30, 2022

(65) Prior Publication Data
US 2023/0320083 A1 Oct. 5, 2023

(51) Int. Cl.
H10B 20/20 (2023.01)

(52) U.S. Cl.
CPC .................... H10B 20/20 (2023.02)

(58) Field of Classification Search
CPC ...... H10B 20/20; H10B 20/25; H01L 23/5252
See application file for complete search history.

(56) References Cited

U.S. PATENT DOCUMENTS

| | | | |
|---|---|---|---|
| 9,123,572 B2 | 9/2015 | Kurjanowicz | |
| 11,456,303 B2* | 9/2022 | Lin | H01L 23/5252 |
| 2011/0312169 A1* | 12/2011 | Kurjanowicz | H10B 20/20 |
| | | | 257/E21.409 |
| 2012/0211841 A1* | 8/2012 | Kurjanowicz | H10B 20/00 |
| | | | 257/369 |
| 2020/0075610 A1* | 3/2020 | Wu | H10B 20/20 |
| 2023/0157009 A1* | 5/2023 | Wu | G11C 17/18 |
| | | | 365/96 |

FOREIGN PATENT DOCUMENTS

| | | |
|---|---|---|
| TW | I630707 | 7/2018 |
| TW | I713040 | 12/2020 |
| TW | I722668 | 3/2021 |
| TW | 202133395 | 9/2021 |

OTHER PUBLICATIONS

"Office Action of Taiwan Counterpart Application", issued on Feb. 18, 2023, p. 1-p. 3.

* cited by examiner

*Primary Examiner* — Shaun M Campbell
(74) *Attorney, Agent, or Firm* — JCIPRNET

(57) ABSTRACT

A semiconductor structure including a semiconductor substrate, an active area, a transistor gate, a fuse gate, a first dielectric pattern, a second dielectric pattern and a plurality of metal lines is provided. The active area is disposed in the semiconductor substrate. The transistor gate has a first line segment and a second line segment extending across the active area in a first direction. The fuse gate located between the first line segment and the second line segment extends across the active area in the first direction. The first dielectric pattern is disposed between the active area and the transistor gate. The second dielectric pattern is disposed between the active area and the fuse gate. The metal lines disposed on two opposite sides of the transistor gate are electrically connected to the active device.

9 Claims, 3 Drawing Sheets

SEMICONDUCTOR STRUCTURE

BACKGROUND

Technical Field

The present disclosure relates to integrated circuit technology, and more particularly, to an electrically-programmable semiconductor structure for integrated circuit devices.

Description of Related Art

The semiconductor industry continues to improve the integration density of various electronic components (e.g., transistors, resistors, capacitors, etc.) by continual reductions in minimum feature size, which allow more components to be integrated into a given area. Integrated circuit (IC) devices are usually made with all internal connections set during the manufacturing process. However, the end users often desire circuits which can be configured or programmed in the field. Such circuits are called programmable circuits and usually contain programmable links. Programmable links are electrical interconnects which are either broken or created at selected electronic nodes by the user after the integrated circuit device has been fabricated and packaged in order to activate or deactivate respective selected electronic nodes.

An anti-fuse is one type of the programmable links that has been developed for IC devices. The programming mechanism in the anti-fuse creates a short circuit or a relatively low resistance link therein. The combination of the open circuit and the short circuit of anti-fuse represents a digital bit pattern of ones and zeros signifying data that the user wishes to store in the IC device. However, anti-fuse structures may occupy a large footprint over semiconductor substrates, and a high current density and a high electric field may be needed. As the size of the integrated circuit are further decreased, anti-fuse with favorable size and breakdown conditions are required.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

The disclosure provides a semiconductor structure including an anti-fuse and a controlling transistor whose configuration is more compact.

A semiconductor structure of the disclosure includes: a semiconductor substrate, at least one active area, a transistor gate, a fuse gate, a first dielectric pattern, a second dielectric pattern and a plurality of metal lines. The at least one active area is/are disposed in the semiconductor substrate. The transistor gate is disposed over the at least one active area and has a first line segment and a second line segment. The first line segment and the second line segment extend across the at least one active area in a first direction. The fuse gate is disposed over the at least one active area and is located between the first line segment and the second line segment. The fuse gate extends across the at least one active area in the first direction. The at least one active area each have a first doping area between the first line segment and the fuse gate, a second doping area between the second line segment and the fuse gate, a third doping area on one side of the first line segment away from the fuse gate, and a fourth doping area on one side of the second line segment away from the fuse gate. The first dielectric pattern is disposed between the at least one active area and the transistor gate. The second dielectric pattern is disposed between the at least one active area and the fuse gate. The metal lines are electrically and respectively connected to the third doping area and the fourth doping area of the at least one active area.

In an embodiment of the disclosure, the first line segment and the second line segment of the transistor gate and the fuse gate are arranged in a second direction. The at least one active area and the metal lines extend in the second direction.

In an embodiment of the disclosure, the at least one active area is a plurality of active areas. An isolation structure is provided between the active areas.

In an embodiment of the disclosure, the isolation structure is a shallow trench isolation.

In an embodiment of the disclosure, an overlapping area of the fuse gate and the at least one active area is less than an overlapping area of the at least one active area and one of the first line segment and the second line segment of the transistor gate.

In an embodiment of the disclosure, the at least one active area each have a first portion, a second portion and a connecting portion arranged in a second direction. The second direction intersects the first direction. The first portion has a first edge between the first line segment and the fuse gate. The second portion has a second edge between the second line segment and the fuse gate. The connecting portion connects the first edge of the first portion and the second edge of the second portion. The first portion and the second portion each have a first width along the first direction. The connecting portion has a second width along the first direction, and the second width is less than the first width.

In an embodiment of the disclosure, the first line segment of the transistor gate extends across the first portion. The second line segment of the transistor extends across the second portion. The fuse gate extends across the connecting portion.

In an embodiment of the disclosure, the first line segment and the second line segment of the transistor gate respectively have a first side edge and a second side edge opposite to each other. A first spacing is provided between the first edge of the first portion and the first side edge of the first line segment. A second spacing is provided between the second edge of the second portion and the second side edge of the second line segment. The first portion and the second portion respectively have a first length and a second length along the second direction. The first spacing and the second spacing are greater than or equal to zero percentage of the first length of the first portion or the second length of the second portion.

In an embodiment of the disclosure, the first spacing and the second spacing are less than or equal to ten percentage of the first length of the first portion or the second length of the second portion.

In an embodiment of the disclosure, the orthogonal projection of the at least one active area on the semiconductor substrate has a contour of dumbbell shape.

Based on the above, in the semiconductor structure according to an embodiment of the disclosure, two parallel line segments of a transistor gate are disposed over an active area with a fuse gate interposed inbetween. The active area, the transistor gate, a first dielectric pattern and two source/drain electrodes (i.e. end portions of two metal lines) form a select transistor. A part of the active area, the fuse gate and a second dielectric pattern may form an anti-fuse. Since the electric signal is transmitted from the select transistor to the anti-fuse through the same active area instead of passing through an additional metal line, the path loss of the electric signal and signal interference can be avoided. Meanwhile, the size of the semiconductor structure including the select transistor and the anti-fuse can be significantly reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
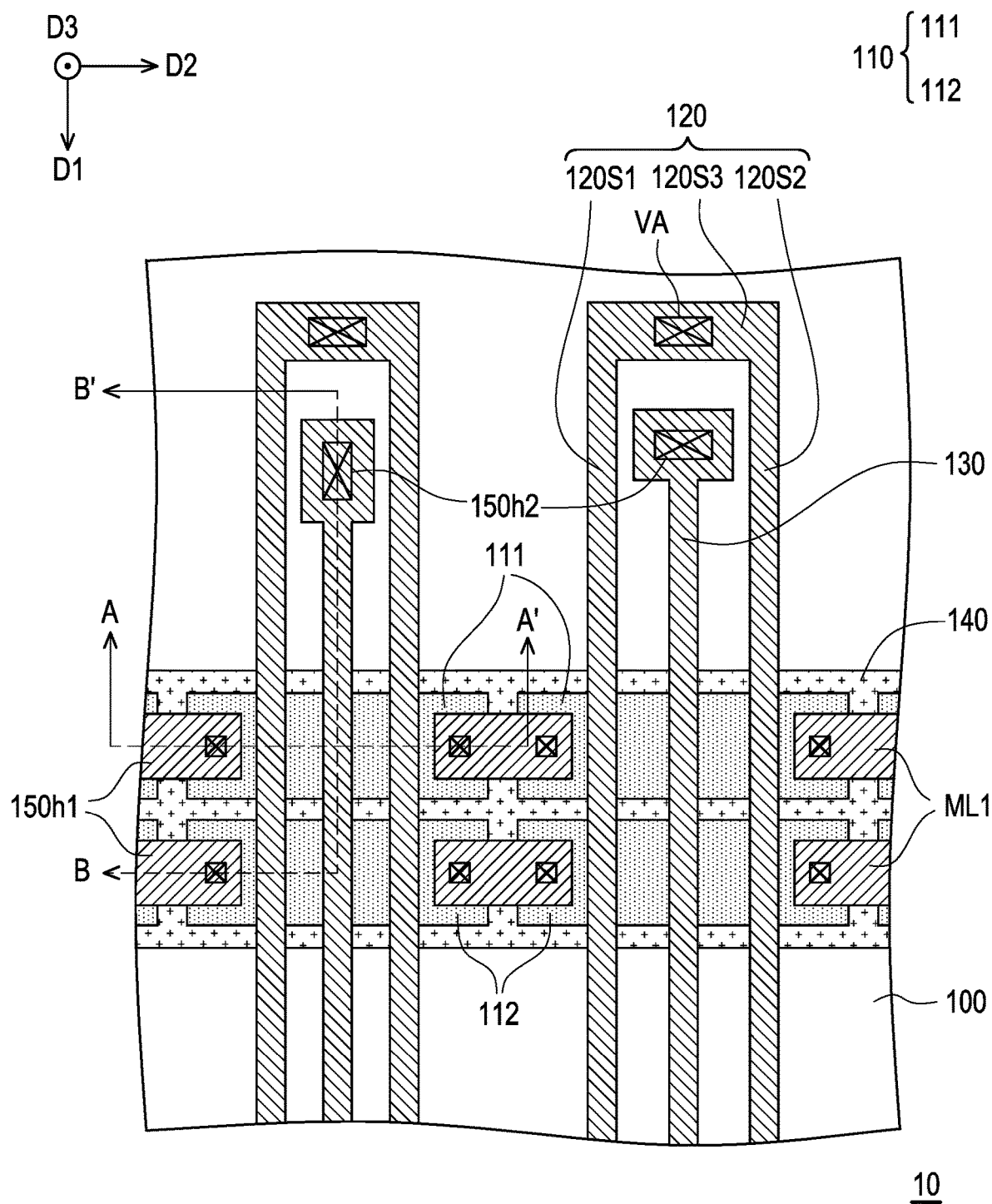
FIG. 1 is a schematic top view of a semiconductor structure according to a first embodiment of the invention.

In the drawings, thicknesses of layers, films, panels, regions, etc., are exaggerated for the sake of clarity. It should be understood that when a device such as a layer, film, region, or substrate is referred to as being "on", or "connected to" another device, it may be directly on or connected to another device, or intermediate devices may also be present. In contrast, when a device is referred to as being "directly on" or "directly connected to" another device, no intermediate devices are present. As used herein, the term "connected" may refer to physical connection and/or electrical connection. Furthermore, "electrically connected" may encompass the presence of other devices between two devices.

Reference will now be made in detail to exemplary embodiments provided in the disclosure, examples of which are illustrated in the accompanying drawings. Wherever possible, identical reference numerals are used in the drawings and descriptions to refer to identical or similar parts.

Figure 2:
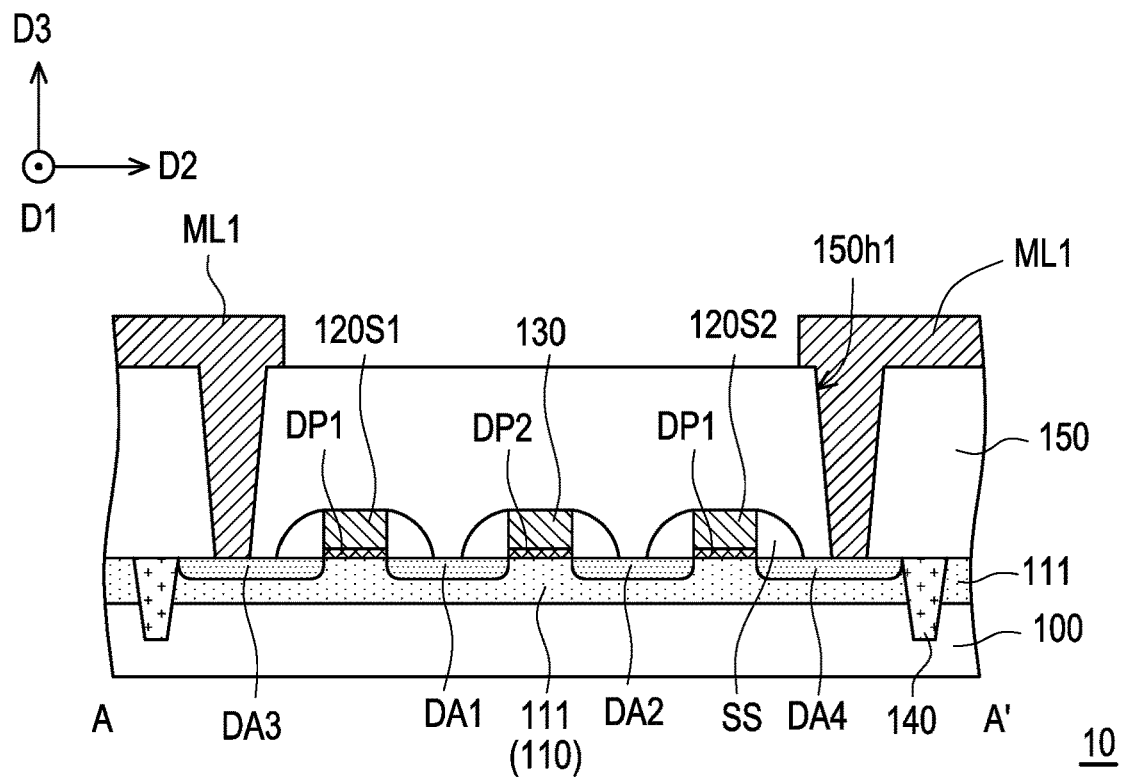
FIG. 2 is a schematic cross-sectional view of the semiconductor structure in FIG. 1.
Figure 3:
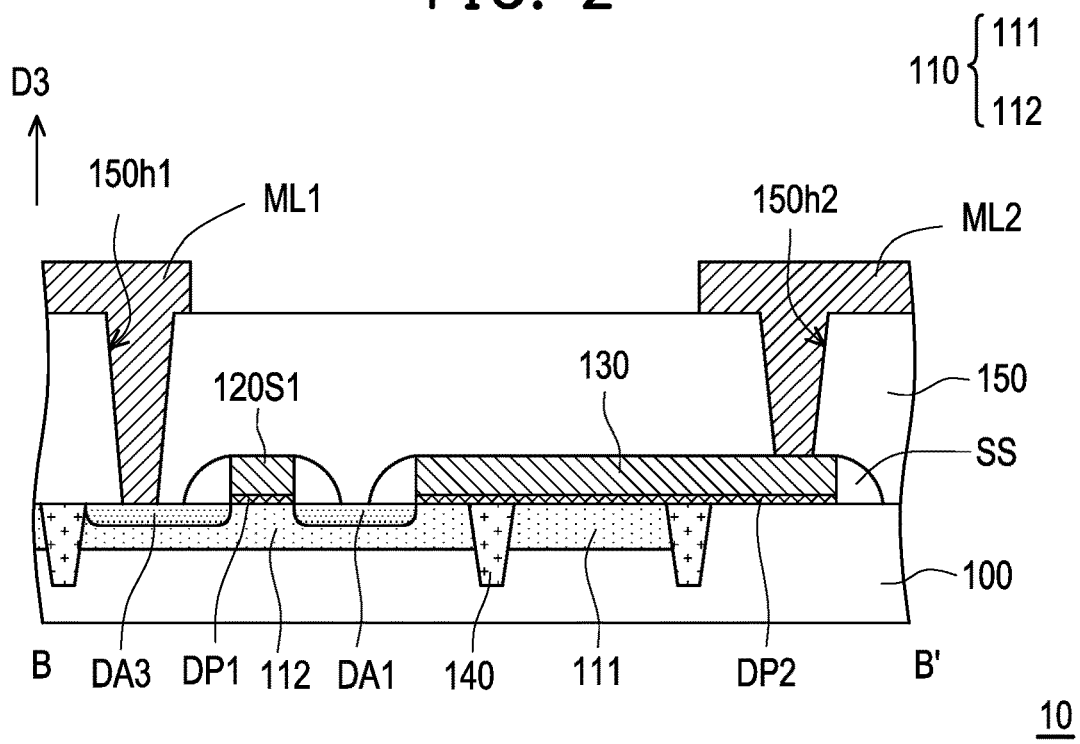
FIG. 3 is a schematic cross-sectional view of the semiconductor structure in FIG. 1.

FIG. 1 is a schematic top view of a semiconductor structure according to a first embodiment of the invention. FIG. 2 is a schematic cross-sectional view of the semiconductor structure in FIG. 1. FIG. 3 is a schematic cross-sectional view of the semiconductor structure in FIG. 1. FIG. 2 and FIG. 3 respectively corresponds to section line A-A' and section line B-B' of FIG. 1. For the sake of clarity, FIG. 1 omits the illustration of the metal line ML2 of FIG. 2.

Referring to FIG. 1, FIG. 2 and FIG. 3, a semiconductor structure 10 includes a semiconductor substrate 100, at least one active area 110, a transistor gate 120, a fuse gate 130, a first dielectric pattern DP1, a second dielectric pattern DP2, and a plurality of metal lines ML1. The active area 110 is disposed in the semiconductor substrate 10. The transistor gate 120 and the fuse gate 130 are correspondingly disposed over the same active area 110. The first dielectric pattern DP1 is disposed between the active area 110 and the transistor gate 120. The second dielectric pattern DP2 is disposed between the active area 110 and the fuse gate 130. The metal lines ML1 are electrically connected to the at least one active area 110.

In the present embodiment, each active area 110 (for example, an active area 111 or an active area 112) overlaps one transistor gate 120 and one fuse gate 130. What needs to be explained is that the overlapping relationship between the transistor gate 120 (or fuse gate 130) and the active area 110 is defined along a normal direction (for example, a direction D3) of a surface of the semiconductor substrate 100. Unless specifically mentioned, the overlapping relationship between any two components in the following is defined in the same way.

The active area 110, the transistor gate 120, a first dielectric pattern DP1 and two source/drain electrodes (i.e. end portions of two metal lines ML1 overlapping the active area 110) may form a select transistor. A part of the active area 110, the fuse gate 130, a second dielectric pattern DP2 may form an anti-fuse. The material of the dielectric patterns may include silicon dioxide, silicon oxynitride, silicon carbon nitride or any silicon compound that can be used in isolation purpose. In the present embodiment, the semiconductor structure 10 may have a plurality of select transistors and anti-fuses. Each combination of one select transistor and one anti-fuse may form an anti-fuse structure.

For example, the anti-fuse structure may be configured as a redundant repair component applied to a memory device like DRAM (Dynamic Random-Access Memory). The memory device may include a plurality of memory cells and redundant cells. When a memory cell is found to malfunction, the anti-fuse structure connected to the malfunctioning memory cell may be fused to remap the memory location from the malfunctioning memory cell to the redundant cell. However, the invention is not limited thereto. In some embodiments, the anti-fuse structure may also be configured to customize an integrated circuit after is has been fabricated. For example, some anti-fuse structures may be fused to alter the connections in the integrated circuit to meet the requirement of a particular application.

In the present embodiment, semiconductor structure 10 may include a plurality of anti-fuse structures. The anti-fuse structures may be respectively arranged into a plurality of anti-fuse strings along a direction D2, and the anti-fuse strings may be arranged in a direction D1. The direction D1 intersects the direction D2. In other words, the anti-fuse structures of the present embodiment may be arranged into a two-dimensional anti-fuse array. For example, the active areas of one anti-fuse string may be interconnected in series by multiple metal lines ML1. In detail, the semiconductor structure 10 may further includes an insulation layer 150 covering the transistor gate 120, the fuse gate 130 and the active area 110. The metal lines ML1 may be disposed on the insulation layer 150 and electrically connected to the active areas 110 through a plurality of contact holes 150h1 of the insulation layer 150.

Further, the transistor gate 120 may include a first line segment 120S1, a second line segment 120S2 and a connecting segment 120S3. The first line segment 120S1 and the second line segment 120S2 are separately arranged in the direction D2 and extend across at least one active area 110 in the direction D1. The connecting segment 120S3 is connected between the first line segment 120S1 and the second line segment 120S2. In other words, the select transistor of the present embodiment is a double-gate transistor. Each transistor gate 120 may be connected to a metal line (not illustrated) through a contact hole VA overlapping the connecting segment 120S3, and the metal line herein may be a word line.

The fuse gate 130 is interposed between the first line segment 120S1 and the second line segment 120S2, and extends across at least one active area 110 in the direction D1. It should be noticed that the transistor gate 120 and the fuse gate 130 of each anti-fuse structure overlap the same active area 110, so that the electric signal may be transmitted from the select transistor to the anti-fuse through the same active area 110 instead of passing through an additional metal line. Therefore, a path loss of the electric signal and signal interference may be avoided.

For example, the insulation layer 150 may further includes a plurality of contact holes 150h2, and the fuse gate 130 may be connected to a metal line ML2 through the contact hole 150h2. The metal line ML1 and the metal line ML2 are configured to provide a programming voltage across the fuse gate 130 and the corresponding active area 110 (i.e. active area 111 or active area 112). The anti-fuse is a normally open circuit, i.e., the metal line ML1 and the metal line ML2 are electrically disconnected from each other in a normal state. The anti-fuse may be blown to be a short circuit when a programming voltage greater than the breakdown voltage of the second dielectric pattern DP2 is provided between the fuse gate 130 and the active area 110. When the anti-fuse is fused, an electrical connection can be made between the fuse gate 130 (or metal line ML2) and the active area 110, and remapping the memory location from the malfunctioning memory cell to the redundant cell is achieved.

On the other hand, since no space is required for additional metal line routing between the select transistor and the anti-fuse, the size of the anti-fuse structure including the select transistor and the anti-fuse can be significantly reduced. In the present embodiment, each transistor gate 120 and fuse gate 130 interposed inbetween may overlap two active areas 110, for example, the active area 111 and the active area 112. The active area 111 and the active area 112 are arranged in an extending direction (i.e. direction D1) of the fuse gate 130 and two line segments of the transistor gate 120. More specifically, the anti-fuse structures arranged in the direction D1 may have the same transistor gate 120 and fuse gate 130, so that the space for deploying the anti-fuse array may be further reduced.

In the present embodiment, an isolation structure 140 such as a shallow trench isolation (STI) structure may be formed in the semiconductor substrate 100, thereby defining a plurality of active areas 110. That is, the isolation structure 140 is provided between the active areas 110. The material of the isolation structure 140 may include silicon oxide, silicon nitride or a combination thereof.

Further, each active area 110 may has a first doping area DA1 between the first line segment 120S1 and the fuse gate 130, a second doping area DA2 between the second line segment 120S2 and the fuse gate 130, a third doping area DA3 on one side of the first line segment 120S1 away from the fuse gate 130, and a fourth doping area DA4 on one side of the second line segment 120S2 away from the fuse gate 130. The third doping area DA3 and the fourth doping area DA4 of each active area 110 are electrically and respectively connected to two metal lines ML1 via two contact holes 150h1.

The doping areas may be comprised of implanted dopant materials (for example, N-type dopants for NMOS devices and P-type dopants for PMOS device) that are implanted into the semiconductor substrate 100 using known masking and ion implantation techniques. In the present embodiment, a sidewall of each of the transistor gates 120 and the fuse gate 130 may be provided with a spacer structure SS to create a deep doping region (not illustrated) of each doping area, but the invention is not limited thereto. The material of the spacer structure SS may include silicon nitride.

In the following, other embodiments are provided to explain the disclosure in detail, wherein same components will be denoted by the same reference numerals, and the description of the same technical content will be omitted. For the omitted part, please refer to the foregoing embodiment, and the details are not described below. The descriptions regarding the omitted part may be referred to the previous embodiment, and thus will not be repeated herein.

Figure 4:
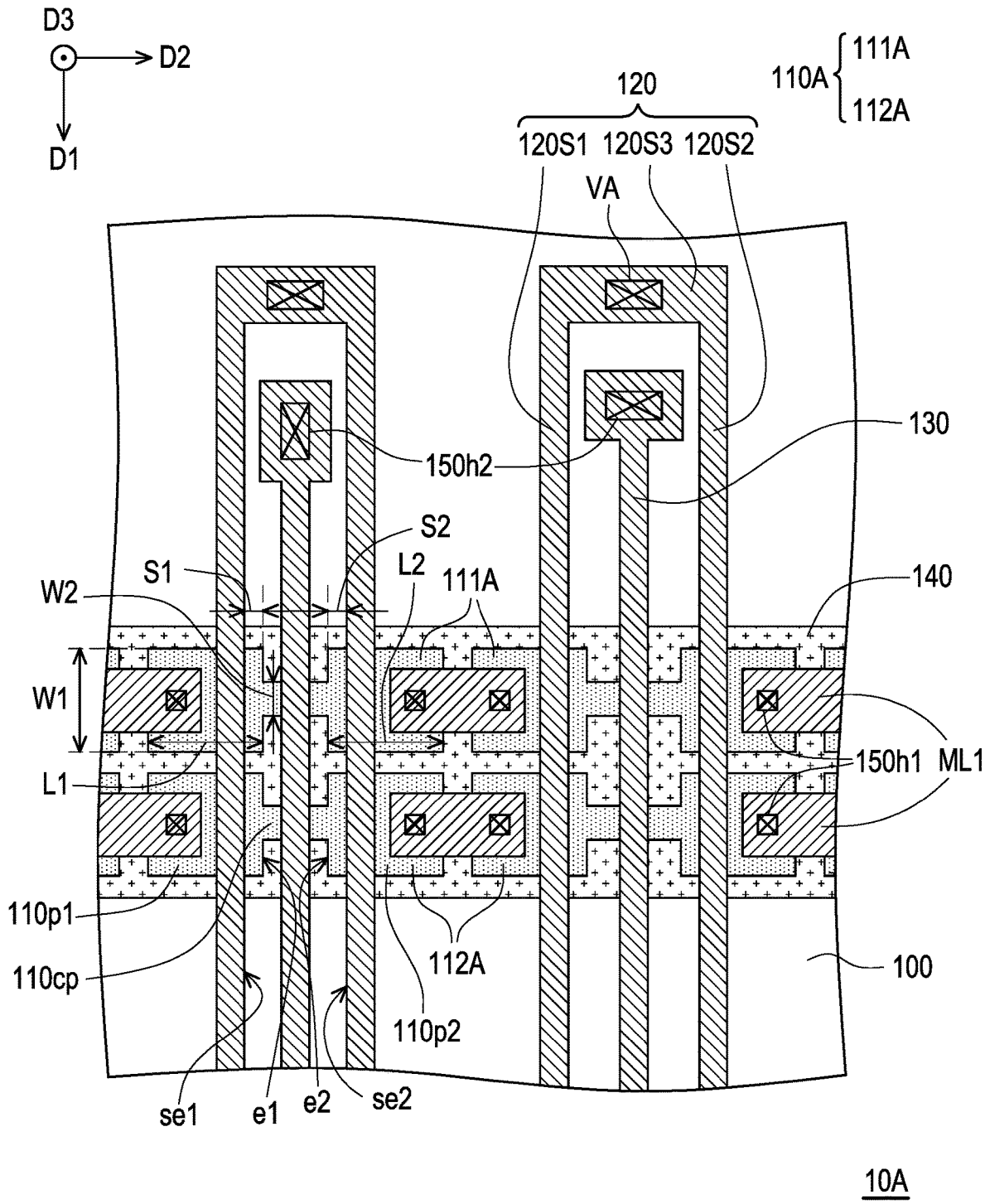
FIG. 4 is a schematic top view of a semiconductor structure according to a second embodiment of the invention.

FIG. 4 is a schematic top view of a semiconductor structure according to a second embodiment of the invention. Referring to FIG. 4, the difference between the semiconductor structure 10A of the present embodiment and the semiconductor structure 10 of FIG. 1 lies in that the configuration of the active area is different. Specifically, the orthogonal projection of the active area 110A on the semiconductor substrate 100 has a contour of dumbbell shape in the present embodiment.

In detail, the active areas 110A (for example, active area 111A or active area 112A) each have a first portion 110p1, a second portion 110p2 and a connecting portion 110cp arranged in the direction D2. The first portion 110p1 has a first edge e1 between the first line segment 120S1 and the fuse gate 130. The second portion 110p2 has a second edge e2 between the second line segment 120S2 and the fuse gate 130. The connecting portion 110cp connects the first edge e1 of the first portion 110p1 and the second edge e2 of the second portion 110p2.

The first line segment 120S1 of the transistor gate 120 extends across the first portion 110p1. The second line segment 120S2 of the transistor gate 120 extends across the second portion 110p2. The fuse gate 130 extends across the connecting portion 110cp. It should be noticed that the first portion 110p1 and the second portion 110p2 each have a first width W1 along the direction D1, the connecting portion 110cp has a second width W2 along the direction D1, and the second width W2 is less than the first width W1. From another point of view, an overlapping area of the fuse gate 130 and each active area 110A is less than an overlapping area of the corresponding active area 110A and one of the first line segment 120S1 and the second line segment 120S2 of the transistor gate 120. Accordingly, not only the space for deploying the anti-fuse array but also the blown resistance of the anti-fuse may be reduced.

Further, the first line segment 120S1 and the second line segment 120S2 of the transistor gate 120 respectively have a first side edge se1 and a second side edge se2 opposite to each other. A first spacing S1 is provided between the first edge e1 of the first portion 110p1 and the first side edge se1 of the first line segment 120S1. A second spacing S2 is provided between the second edge e2 of the second portion 110p2 and the second side edge se2 of the second line segment 120S2. The first portion 110p1 and the second portion 110p2 respectively have a first length L1 and a second length L2 along the direction D2. The first spacing S1 and the second spacing S2 are preferably greater than or equal to zero percentage of the first length L1 of the first portion 110p1 (or the second length L2 of the second portion 110p2) and less than or equal to ten percentage of the first length L1 of the first portion 110p1 (or the second length L2 of the second portion 110p2). For example, the first spacing S1 and the second spacing S2 may be greater than or equal to 40 nm and less than or equal to 200 nm. Such that, the influence of rounding effect at the corner of the active area on the performance of the anti-fuse structure may be reduced or the transistor gate 120 may fall of active area which induce worse device characteristic.

In summary, in the semiconductor structure according to an embodiment of the disclosure, two parallel line segments of a transistor gate are disposed over an active area with a fuse gate interposed inbetween. The active area, the transistor gate, a first dielectric pattern and two source/drain electrodes (i.e. end portions of two metal lines) form a select transistor. A part of the active area, the fuse gate and a second dielectric pattern may form an anti-fuse. Since the electric signal is transmitted from the select transistor to the anti-fuse through the same active area instead of passing through an additional metal line, the path loss of the electric signal and signal interference can be avoided. Meanwhile, the size of the semiconductor structure including the select transistor and the anti-fuse can be significantly reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:
    a semiconductor substrate;
    at least one active area, disposed in the semiconductor substrate, wherein the orthogonal projection of the at least one active area on the semiconductor substrate has a contour of dumbbell shape;
    a transistor gate, disposed over the at least one active area, the transistor gate has a first line segment and a second line segment, the first line segment and the second line segment extend across the at least one active area in a first direction;
    a fuse gate, disposed over the at least one active area, the fuse gate is located between the first line segment and the second line segment and extends across the at least one active area in the first direction, wherein the at least one active area each have a first doping area between the first line segment and the fuse gate, a second doping area between the second line segment and the fuse gate, a third doping area on one side of the first line segment away from the fuse gate, and a fourth doping area on one side of the second line segment away from the fuse gate;
    a first dielectric pattern, disposed between the at least one active area and the transistor gate;
    a second dielectric pattern, disposed between the at least one active area and the fuse gate; and
    a plurality of metal lines, electrically and respectively connected to the third doping area and the fourth doping area of the at least one active area.

2. The semiconductor structure as claimed in claim 1, wherein the first line segment and the second line segment of the transistor gate and the fuse gate are arranged in a second direction, and the at least one active area and the metal lines extend in the second direction.

3. The semiconductor structure as claimed in claim 1, wherein the at least one active area is a plurality of active areas, and an isolation structure is provided between the active areas.

4. The semiconductor structure as claimed in claim 3, wherein the isolation structure is a shallow trench isolation.

5. The semiconductor structure as claimed in claim 1, wherein an overlapping area of the fuse gate and the at least one active area is less than an overlapping area of the at least one active area and one of the first line segment and the second line segment of the transistor gate.

6. The semiconductor structure as claimed in claim 1, wherein the at least one active area each have a first portion, a second portion and a connecting portion arranged in a second direction, the second direction intersects the first direction, the first portion has a first edge between the first line segment and the fuse gate, the second portion has a second edge between the second line segment and the fuse gate, the connecting portion connects the first edge of the first portion and the second edge of the second portion, the first portion and the second portion each have a first width along the first direction, the connecting portion has a second width along the first direction, and the second width is less than the first width.

7. The semiconductor structure as claimed in claim 6, wherein the first line segment of the transistor gate extends across the first portion, the second line segment of the transistor extends across the second portion, and the fuse gate extends across the connecting portion.

8. The semiconductor structure as claimed in claim 6, wherein the first line segment and the second line segment of the transistor gate respectively have a first side edge and a second side edge opposite to each other, a first spacing is provided between the first edge of the first portion and the first side edge of the first line segment, a second spacing is provided between the second edge of the second portion and the second side edge of the second line segment, the first portion and the second portion respectively have a first length and a second length along the second direction, and the first spacing and the second spacing are greater than or equal to zero percentage of the first length of the first portion or the second length of the second portion.

9. The semiconductor structure as claimed in claim 8, wherein the first spacing and the second spacing are less than or equal to ten percentage of the first length of the first portion or the second length of the second portion.

* * * * *